(12) United States Patent
Shibata et al.

(10) Patent No.: US 7,323,806 B2
(45) Date of Patent: Jan. 29, 2008

(54) PIEZOELECTRIC THIN FILM ELEMENT

(75) Inventors: Kenji Shibata, Tsukuba (JP); Hideki Sato, Tsuchiura (JP)

(73) Assignee: Hitachi Cable, Ltd., Tokyo (JP)

( * ) Notice: Subject to any disclaimer, the term of this patent is extended or adjusted under 35 U.S.C. 154(b) by 70 days.

(21) Appl. No.: 11/316,675

(22) Filed: Dec. 23, 2005

(65) Prior Publication Data

US 2007/0024162 A1    Feb. 1, 2007

(30) Foreign Application Priority Data

Aug. 1, 2005    (JP) .............................. 2005-222923

(51) Int. Cl.
*H01L 41/08* (2006.01)
*H01L 41/16* (2006.01)
*H01L 41/18* (2006.01)
*H01L 41/187* (2006.01)
*H01L 41/24* (2006.01)
*B41J 2/045* (2006.01)

(52) U.S. Cl. .......................... 310/358; 347/68; 347/70; 347/71; 347/72; 501/134; 252/62.9 R; 252/62.9 PZ; 257/347

(58) Field of Classification Search ............ 347/68–72; 310/358; 501/134; 252/62.9 R, 62.9 PZ; 257/347
See application file for complete search history.

(56) References Cited

U.S. PATENT DOCUMENTS

| | | | | |
|---|---|---|---|---|
| 3,640,865 A | * | 2/1972 | Burns et al. | ........... 252/62.9 R |
| 5,719,607 A | * | 2/1998 | Hasegawa et al. | ............ 347/70 |
| 5,721,182 A | * | 2/1998 | Reichert et al. | ............ 501/134 |
| 5,802,686 A | * | 9/1998 | Shimada et al. | ............... 347/70 |
| 6,093,339 A | * | 7/2000 | Kimura et al. | ......... 252/62.9 R |
| 6,586,861 B2 | * | 7/2003 | Misu et al. | ................. 310/324 |
| 2004/0058797 A1 | | 3/2004 | Nonoyama et al. | |
| 2004/0207695 A1 | | 10/2004 | Aoto et al. | |
| 2005/0006618 A1 | * | 1/2005 | Nanao et al. | .......... 252/62.9 R |

FOREIGN PATENT DOCUMENTS

| | | |
|---|---|---|
| JP | 2004-260158 | 9/2004 |
| JP | 2004-300012 | 10/2004 |

\* cited by examiner

*Primary Examiner*—J. San Martin
(74) *Attorney, Agent, or Firm*—McGinn IP Law Group, PLLC

(57) ABSTRACT

A thin-film piezoelectric element has a substrate, a lower electrode, a piezoelectric portion, and an upper electrode that are sequentially formed on the substrate. The piezoelectric portion has a dielectric thin film that has an alkali niobium oxide-based perovskite structure expressed by general formula $(Na_xK_yLi_z)NbO_3$ ($0<x<1$, $0<y<1$, $0 \leq z<1$, $x+y+z=1$), and a high voltage-withstand dielectric that has a dielectric strength voltage greater than that of the dielectric thin film.

12 Claims, 12 Drawing Sheets

1 THIN-FILM PIEZOELECTRIC ELEMENT

7 Pt UPPER ELECTRODE
6 SrTiO₃ THIN FILM
5 (Na, K, Li)NbO₃ PIEZOELECTRIC THIN FILM
3 Pt LOWER ELECTRODE
2A MgO SUBSTRATE (COMPARISON EXAMPLE 1)

1 THIN-FILM PIEZOELECTRIC ELEMENT

7 Pt UPPER ELECTRODE
5 (Na, K, Li)NbO$_3$ PIEZOELECTRIC THIN FILM
3 Pt LOWER ELECTRODE
2A MgO SUBSTRATE

F I G. 1 0
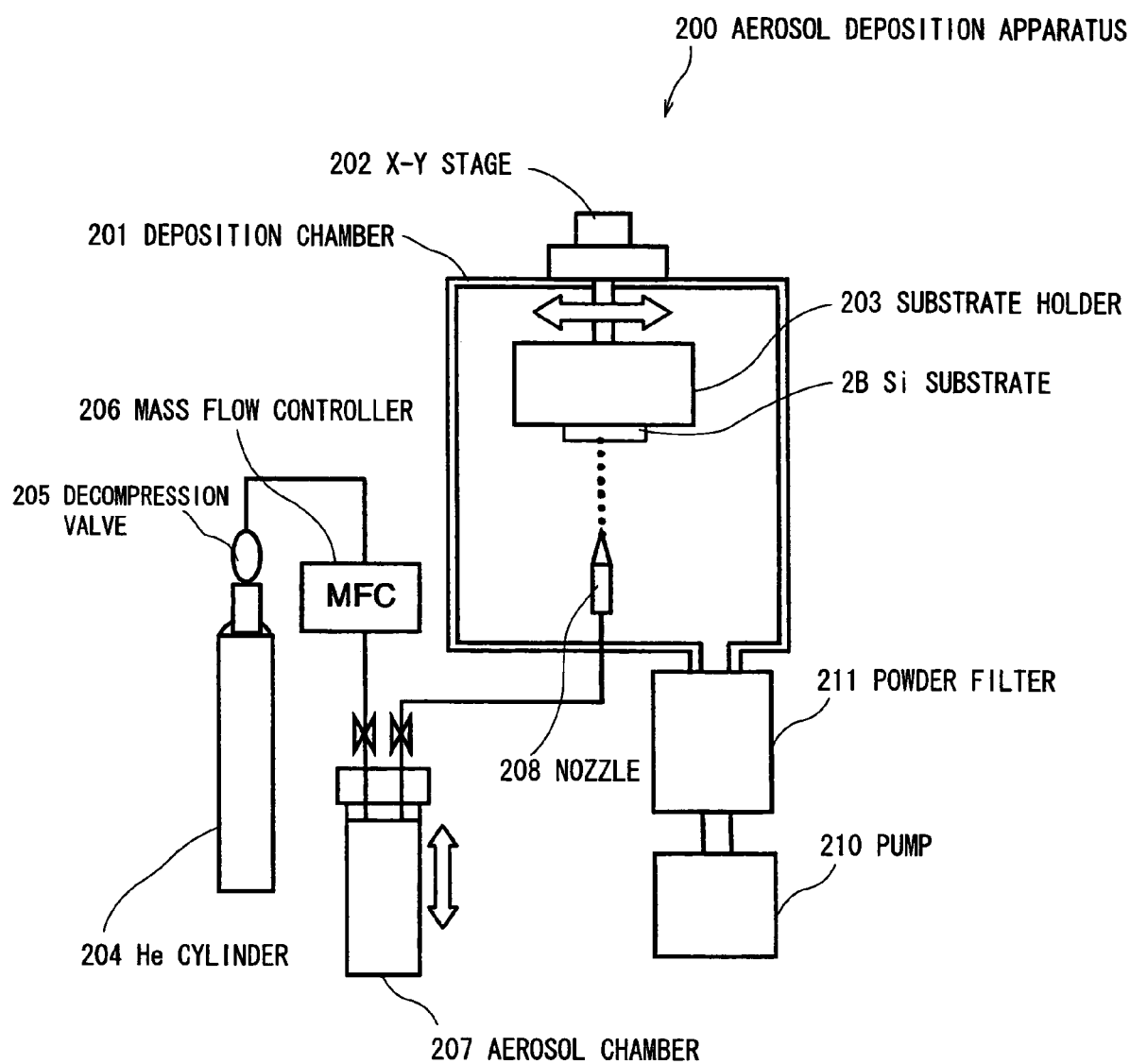

(COMPARISON EXAMPLE 2)

PIEZOELECTRIC THIN FILM ELEMENT

The present application is based on Japanese patent application No. 2005-222923, the entire contents of which are incorporated herein by reference.

BACKGROUND OF THE INVENTION

1. Field of the Invention

This invention relates to a thin-film piezoelectric element that can be applied to ink-jet printers, scanners, gyros, ultrasonic generators, ultrasonic sensors, pressure sensors, and velocity/acceleration sensors and, particularly, to a thin-film piezoelectric element using lead-free piezoelectric material and having excellent dielectric strength voltage.

2. Description of the Related Art

Piezoelectric substances are processed into various piezoelectric elements according to various purposes, and are utilized widely particularly as functional electronic components, such as an actuator, which applies voltage to cause deformation, a sensor, which conversely uses deformation of an element to generate voltage.

As piezoelectric substances utilized in actuator and sensor applications, there have hitherto been widely used lead-based ferroelectrics having large piezoelectric properties, especially, $Pb(Zr_{1-x}Ti_x)O_3$-based perovskite-type ferroelectrics called PZT, which are formed by sintering an oxide typically comprising individual elements.

At present, with reduction in size and enhancement in performance of electronic components of each kind, there is also a strong demand for size reduction and performance enhancement of piezoelectric elements as well. However, in piezoelectric material produced by a manufacturing method using primarily a conventional sintering method, as its thickness is made thin, particularly, as the thickness approaches a thickness of the order of 10 μm, and a size of crystal grains constituting the material, the effect of the thickness becomes unnegligible.

For that reason, there arises the problem of noticeable property variation and degradation. In order to avoid it, the formation methods of piezoelectric substances have, in recent years, been studied that apply thin film technology, etc. replaced for the sintering method.

As the thin film technology replaced for the sintering method, a PZT thin film formed by RF (high-frequency) magnetron sputtering has recently been used practically as an actuator for heads of high-definition high-speed inkjet printers (See JP-A-2004-260158, for example).

On the other hand, sintered piezoelectric substances or piezoelectric thin films comprising above-mentioned PZT are undesirable from the points of view of ecology and pollution prevention because they contain lead oxide (PbO) on the order of 60-70 wt %. Accordingly, from environmental concerns, the development of piezoelectric substances that do not contain lead is desired.

At present, various lead-free piezoelectric materials have been studied, of which there is lithium potassium sodium niobate (general formula: $(Na_xK_yLi_z)NbO_3$ (0<x<1, 0<y<1, 0≦z<1, x+y+z=1) (See JP-A-2004-300012, for example). A thin film of this lithium potassium sodium niobate is a lead-free material having perovskite structure that exhibits a relatively good piezoelectric property, and is therefore expected as a major candidate for lead-free piezoelectric material.

However, there is the problem that the thin film of lithium potassium sodium niobate has very low dielectric strength voltage. In particular, because, in the case of use in the form of a piezoelectric thin film, the electric field strength to be applied to the piezoelectric thin film becomes large, this low dielectric strength voltage is a serious problem that significantly obstructs practical use.

SUMMARY OF THE INVENTION

It is an object of the invention to provide a thin-film piezoelectric element that uses a lead-free piezoelectric material and has an excellent dielectric strength voltage.

According to the invention, a thin-film piezoelectric element comprises:

a substrate, a lower electrode, a piezoelectric portion, and an upper electrode that are sequentially formed on the substrate, wherein the piezoelectric portion comprises a dielectric thin film that comprises an alkali niobium oxide-based perovskite structure expressed by general formula $(Na_xK_yLi_z)NbO_3$ (0<x<1, 0<y<1, 0≦z<1, x+y+z=1), and a high voltage-withstand dielectric that has a dielectric strength voltage greater than that of the dielectric thin film.

In the above thin-film piezoelectric element, since the piezoelectric portion comprises a dielectric thin film having alkali niobium oxide-based perovskite structure (a thin film of lithium potassium sodium niobate) expressed by general formula $(Na_xK_yLi_z)NbO_3$ (0<x<1, 0<y<1, 0≦z<1, x+y+z=1), and a high voltage-withstand dielectric whose dielectric strength voltage is greater than that of the thin film of lithium potassium sodium niobate, voltage withstand of the entire piezoelectric portion is enhanced, which thus allows use of even the low dielectric strength voltage thin film of lithium potassium sodium niobate. Also, the thin film of lithium potassium sodium niobate exhibits a relatively good piezoelectric property, and is lead-free material, and is therefore preferred from the points of view of ecology and pollution prevention.

In the above invention, the following modifications and changes can be made.

(i) The high voltage-withstand dielectric is inserted in a layered form between the dielectric thin film and the lower or upper electrode.

(ii) The high voltage-withstand dielectric is inserted in a layered form between the dielectric thin film and the lower electrode and between the dielectric thin film and the upper electrode, respectively.

(iii) The high voltage-withstand dielectric is inserted in a layered form in the dielectric thin film.

(iv) The high voltage-withstand dielectric is mixed as an additive in the dielectric thin film.

(v) The high voltage-withstand dielectric comprises $SrTiO_3$, $\alpha$-$Al_2O_3$, $Ta_2O_5$, or $SiO_2$.

(vi) The high voltage-withstand dielectric has a dielectric strength voltage of 1 MV/cm or higher.

Even in the case of other materials than (v), when its dielectric strength voltage is 1 MV/cm or higher, similar effects are expected.

If a layer with a dielectric strength voltage of less than 1 MV/cm is inserted as the high voltage-withstand dielectric, achieving sufficient dielectric strength voltage requires large film thickness. The large film thickness of the high voltage-withstand dielectric would result in consumption of most of an electric field applied to the thin-film piezoelectric element at this layer, so that voltage is not efficiently applied to the (Na, K, Li)NbO₃ piezoelectric thin film, and intended piezoelectric properties cannot consequently be obtained. It is therefore preferred that the dielectric strength voltage of the high voltage-withstand dielectric is 1 MV/cm or higher.

(vii) The the substrate comprises a MgO monocrystalline substrate or a Si substrate.

As the substrate, there may be used various substrates, such as a MgO monocrystalline substrate, a SrTiO₃ monocrystalline substrate, a silicon substrate, a germanium substrate, a stainless substrate, a copper substrate, an aluminum substrate, an iron substrate, etc. Of these substrates, the MgO monocrystalline substrate and the silicon substrate are preferred from the point of view of microfabrication.

(viii) At least one of the substrate, the lower electrode, the piezoelectric portion and the upper electrode comprises a microfabrication with a width of 1 mm or less. This allows high-density packaging.

(ix) At least one of the lower electrode, the piezoelectric portion and the upper electrode is formed by RF magnetron sputtering. This allows obtaining good surface flatness.

(x) At least one of the lower electrode, the piezoelectric portion and the upper electrode is formed by aerosol deposition (AD). The aerosol deposition allows low-temperature deposition, which therefore allows forming a film with very little residual stress. Also, because of high deposition velocity, it is possible to form a thick or high-density film.

As formation methods of the thin film of lithium potassium sodium niobate and the high voltage-withstand dielectric, there may be used sputtering, CVD, PLD, coating, etc., for example. These allows forming a good-quality and high-density crystalline thin film. Also, of these formation methods, sputtering is preferred because of high film thickness accuracy.

Also, to achieve high piezoelectric properties in this thin-film piezoelectric element, it is desired that the thin film of lithium potassium sodium niobate is oriented at a high ratio in any direction of (001), (100), (010), or (111) plane.

For the lower and upper electrodes, there may be used various electrodes of platinum, palladium, ruthenium, their compounds, etc. In the case of epitaxial growth of a thin dielectric film, etc., on the electrodes, platinum is preferred. Also, an elastic thin film that does not exhibit piezoelectric properties may be mounted on the outer sides of both electrodes or on one side of them.

BRIEF DESCRIPTION OF THE DRAWINGS

The preferred embodiments according to the invention will be explained below referring to the drawings, wherein:

FIG. 10 is a schematic view of an aerosol deposition apparatus;

DETAILED DESCRIPTION OF THE PREFERRED EMBODIMENTS

First Embodiment

Figure 1:
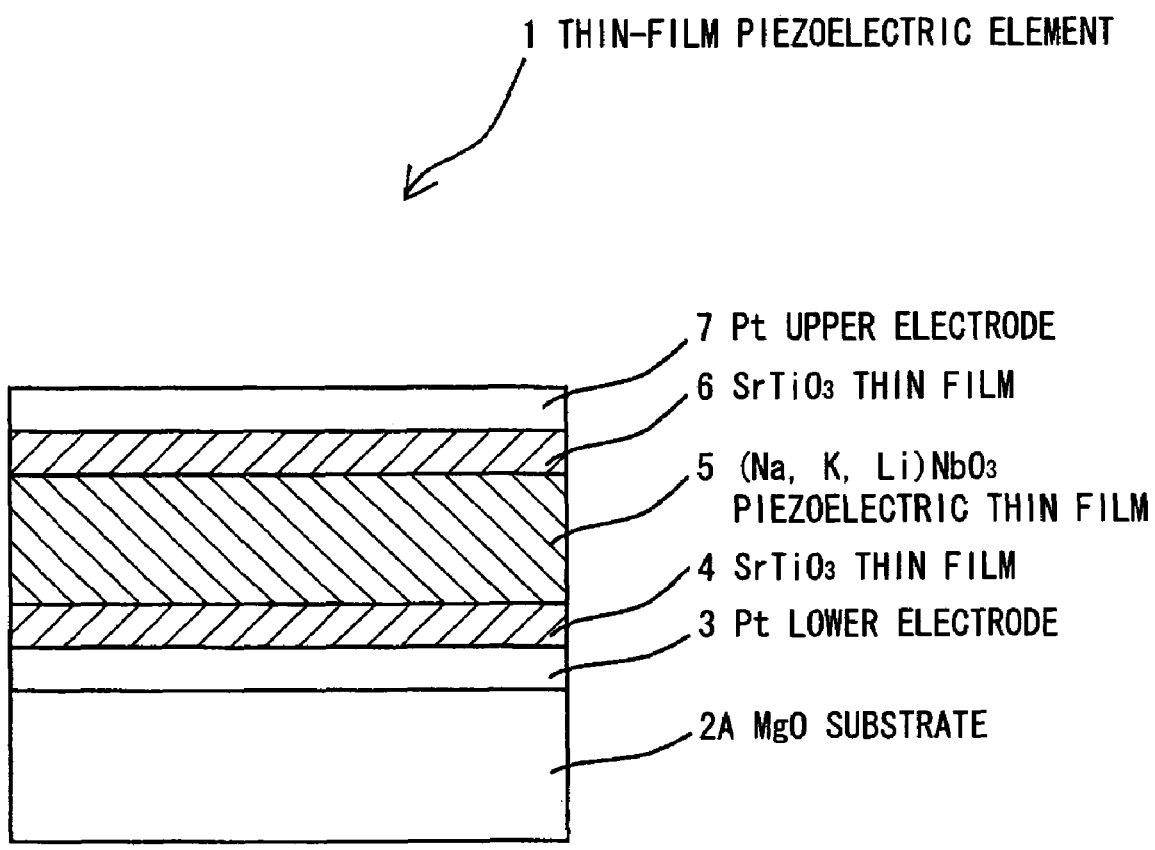
FIG. 1 is a cross-sectional view of a thin-film piezoelectric element according to a first preferred embodiment of the invention.

FIG. 1 illustrates a thin-film piezoelectric element according to a first preferred embodiment of the invention. A thin-film piezoelectric element 1 according to the first embodiment includes a MgO substrate 2A consisting of a MgO single crystal. Using RF (high-frequency) magnetron sputtering, on this MgO substrate 2A, there are sequentially formed a Pt lower electrode 3, a first SrTiO₃ thin film 4 as a high voltage-withstand dielectric, a piezoelectric thin film 5, a second SrTiO₃ thin film 6 as a high voltage-withstand dielectric, and a Pt upper electrode 7. The first SrTiO₃ thin film 4, piezoelectric thin film 5, and second SrTiO₃ thin film 6 make up a piezoelectric portion.

The piezoelectric thin film 5 is made of a dielectric thin film expressed by general formula $(Na_xK_yLi_z)NbO_3$ ($0<x<1$, $0<y<1$, $0\leq z<1$, $x+y+z=1$), and will hereinafter be referred to as (Na, K, Li)NbO₃ piezoelectric thin film 5.

The SrTiO₃ thin films 4 and 6 have a 1 MV/cm or higher dielectric strength voltage, which is greater than that of the (Na, K, Li)NbO₃ piezoelectric thin film 5.

This first embodiment can offer the following advantages:

(a) Sandwiching the (Na, K, Li)NbO₃ piezoelectric thin film 5 between the first and second SrTiO₃ thin films 4 and 6 having excellent dielectric strength voltage allows enhancement in voltage withstand of the entire piezoelectric portion comprising the first and second SrTiO₃ thin films 4 and 6 and piezoelectric thin film 5, which thus allows use of even the low dielectric strength voltage (Na, K, Li)NbO₃ piezoelectric thin film 5.

(b) Because of lead-free piezoelectric material, the (Na, K, Li)NbO₃ piezoelectric thin film 5 is preferable from the points of view of ecology and pollution prevention.

(c) Each thin film formed by the RF magnetron sputtering makes it possible to ensure stabilization of piezoelectric properties.

(d) Sandwiching the (Na, K, Li)NbO₃ piezoelectric thin film 5 between the high voltage-withstand dielectrics allows prevention of diffusion of alkali metals such as Na, K, Li, etc., into the electrodes 3 and 7, which thereby allows extending the lifetime of the piezoelectric element.

(e) Sandwiching the (Na, K, Li)NbO₃ piezoelectric thin film 5 between the high voltage-withstand dielectrics allows good adhesion to the base of the (Na, K, Li)NbO₃ piezoelectric thin film 5, and enhancement in flatness of the piezoelectric element surface.

Second Embodiment

Figure 2:
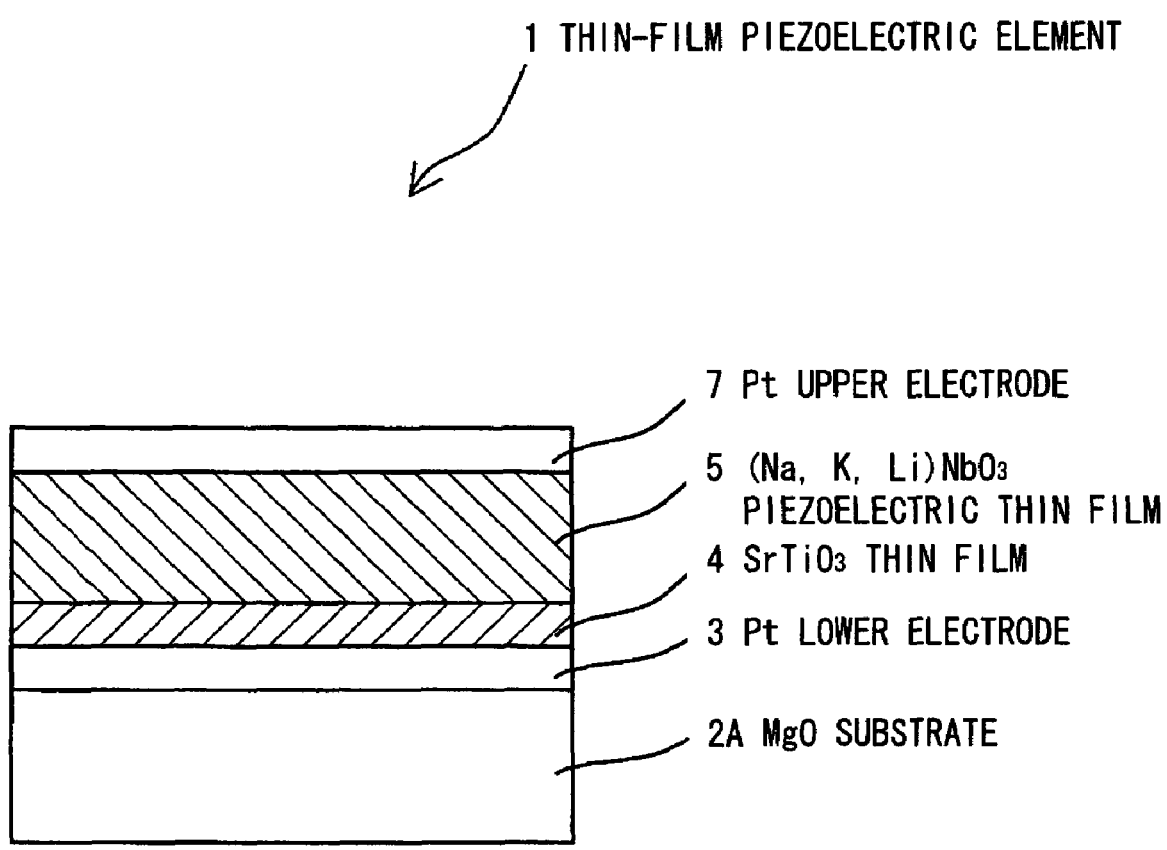
FIG. 2 is a cross-sectional view of a thin-film piezoelectric element according to a second preferred embodiment of the invention.

FIG. 2 illustrates a thin-film piezoelectric element according to a second preferred embodiment of the present invention. A thin-film piezoelectric element 1 according to the second embodiment includes a $SrTiO_3$ thin film 4 formed only underneath a (Na, K, Li)$NbO_3$ piezoelectric thin film 5. Specifically, in this embodiment, using RF (high-frequency) magnetron sputtering, on a MgO substrate 2A consisting of a MgO single crystal, there are sequentially formed a Pt lower electrode 3, a $SrTiO_3$ thin film 4, a (Na, K, Li)$NbO_3$ piezoelectric thin film 5, and a Pt upper electrode 7. The $SrTiO_3$ thin film 4 and piezoelectric thin film 5 make up a piezoelectric portion.

This second embodiment can offer the following advantages:

(a) Stacking to the (Na, K, Li)$NbO_3$ piezoelectric thin film 5 the $SrTiO_3$ thin film 4 having excellent dielectric strength voltage allows enhancement in voltage withstand of the entire piezoelectric portion comprising the $SrTiO_3$ thin film 4 and the (Na, K, Li)$NbO_3$ piezoelectric thin film 5, which thus allows use of even the low dielectric strength voltage (Na, K, Li)$NbO_3$ piezoelectric thin film 5.

(b) The high voltage-withstand dielectric formed underneath the (Na, K, Li)$NbO_3$ piezoelectric thin film 5 allows prevention of diffusion of alkali metals such as Na, K, Li, etc., into the Pt lower electrode 3, which thereby allows extending the lifetime of the piezoelectric element.

(c) The high voltage-withstand dielectric formed underneath the (Na, K, Li)$NbO_3$ piezoelectric thin film 5 allows good adhesion to the base of the (Na, K, Li)$NbO_3$ piezoelectric thin film 5.

Third Embodiment

Figure 3:
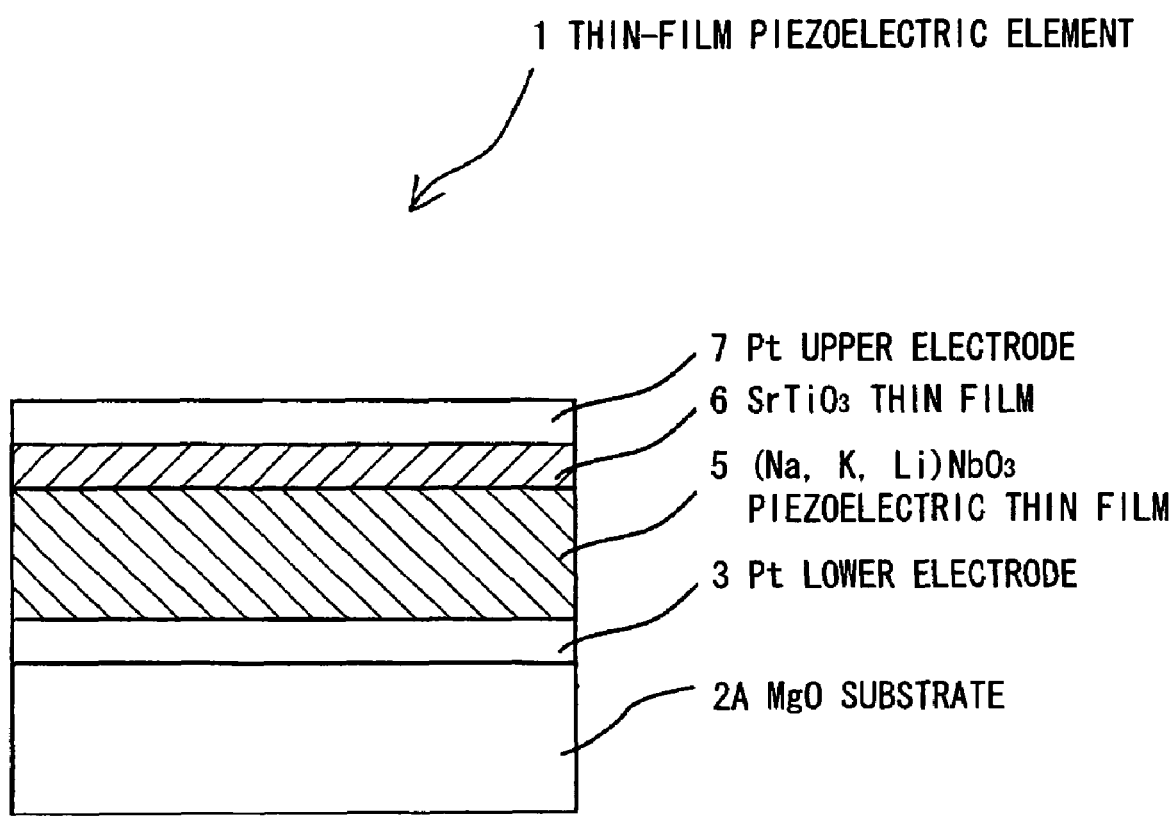
FIG. 3 is a cross-sectional view of a thin-film piezoelectric element according to a third preferred embodiment of the invention.

FIG. 3 illustrates a thin-film piezoelectric element according to a third preferred embodiment of the present invention. A thin-film piezoelectric element 1 according to the third embodiment includes a $SrTiO_3$ thin film 6 formed only on a (Na, K, Li)$NbO_3$ piezoelectric thin film 5. Specifically, in this embodiment, using RF magnetron sputtering, on a MgO substrate 2A consisting of a MgO single crystal, there are sequentially formed a Pt lower electrode 3, a (Na, K, Li)$NbO_3$ piezoelectric thin film 5, a $SrTiO_3$ thin film 6, and a Pt upper electrode 7. The (Na, K, Li)$NbO_3$ piezoelectric thin film 5 and $SrTiO_3$ thin film 6 make up a piezoelectric portion.

This third embodiment can offer the following advantages:

(a) Stacking to the (Na, K, Li)$NbO_3$ piezoelectric thin film 5 the $SrTiO_3$ thin film 6 having excellent dielectric strength voltage allows enhancement in voltage withstand of the entire piezoelectric portion comprising the (Na, K, Li)$NbO_3$ piezoelectric thin film 5 and $SrTiO_3$ thin film 6, which thus allows use of even the low dielectric strength voltage (Na, K, Li)$NbO_3$ piezoelectric thin film 5.

(b) The high voltage-withstand dielectric formed on the (Na, K, Li)$NbO_3$ piezoelectric thin film 5 allows prevention of diffusion of alkali metals such as Na, K, Li, etc., into the Pt upper electrode 7, which thereby allows extending the lifetime of the piezoelectric element.

(c) The high voltage-withstand dielectric formed on the (Na, K, Li)$NbO_3$ piezoelectric thin film 5 allows enhancement in flatness of the piezoelectric element surface.

Fourth Embodiment

Figure 4:
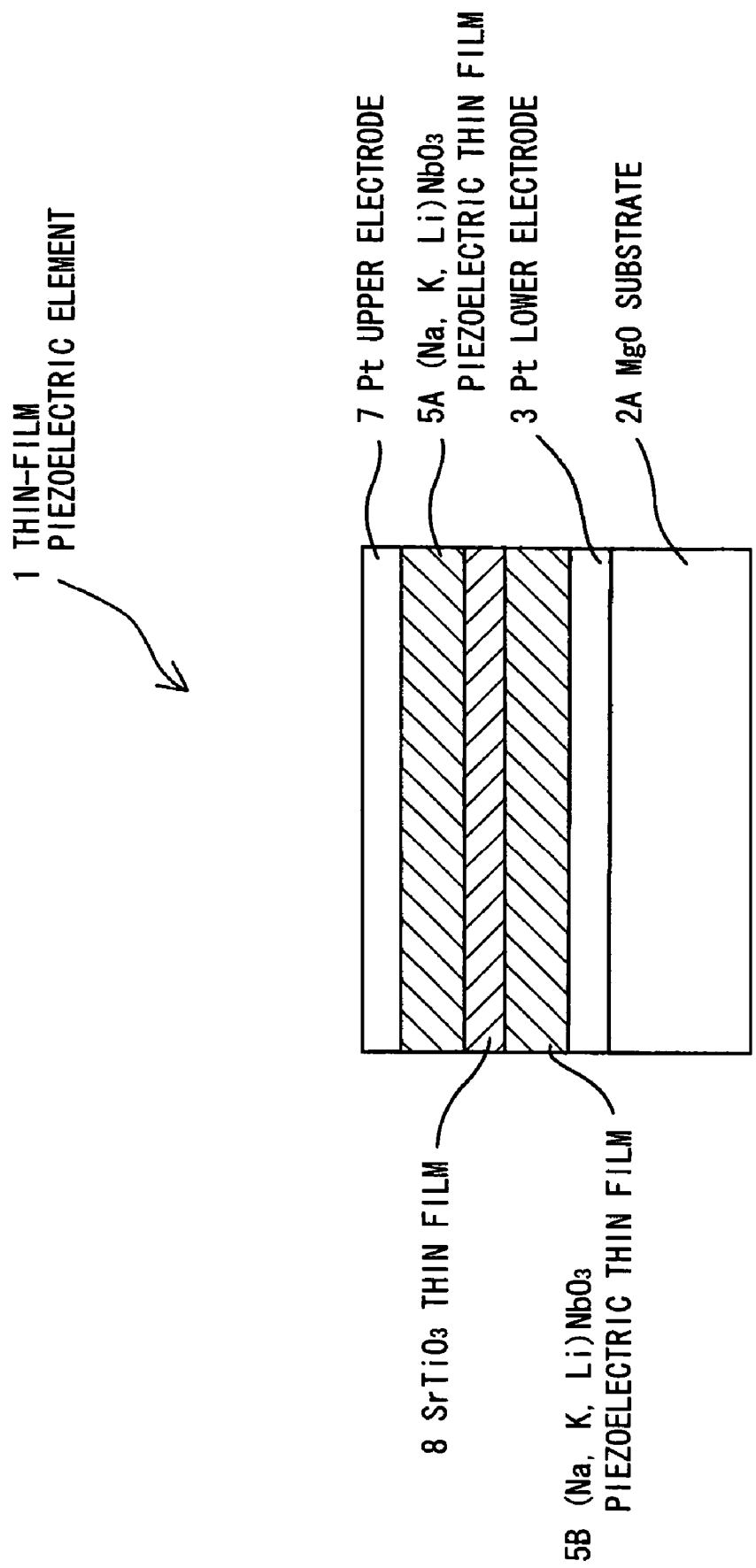
FIG. 4 is a cross-sectional view of a thin-film piezoelectric element according to a fourth preferred embodiment of the invention.

FIG. 4 illustrates a thin-film piezoelectric element according to a fourth preferred embodiment of the invention. A thin-film piezoelectric element 1 according to the fourth embodiment includes a $SrTiO_3$ thin film 8 formed in a (Na, K, Li)$NbO_3$ piezoelectric thin film 5 as a high voltage-withstand dielectric. Specifically, in this embodiment, using RF magnetron sputtering, on a MgO substrate 2A consisting of a MgO single crystal, there are sequentially formed a Pt lower electrode 3, a first (Na, K, Li)$NbO_3$ piezoelectric thin film 5A, a $SrTiO_3$ thin film 8, a second (Na, K, Li)$NbO_3$ piezoelectric thin film 5B, and a Pt upper electrode 7. The (Na, K, Li)$NbO_3$ piezoelectric thin films 5A and 5B and $SrTiO_3$ thin film 8 make up a piezoelectric portion.

According to this fourth embodiment, inserting in the (Na, K, Li)$NbO_3$ piezoelectric thin film 5 the $SrTiO_3$ thin film 8 having excellent dielectric strength voltage allows enhancement in voltage withstand of the entire piezoelectric portion comprising the (Na, K, Li)$NbO_3$ piezoelectric thin films 5A and 5B and $SrTiO_3$ thin film 8, which thus allows use of even the low dielectric strength voltage (Na, K, Li)$NbO_3$ piezoelectric thin film 5.

Fifth Embodiment

Figure 5:
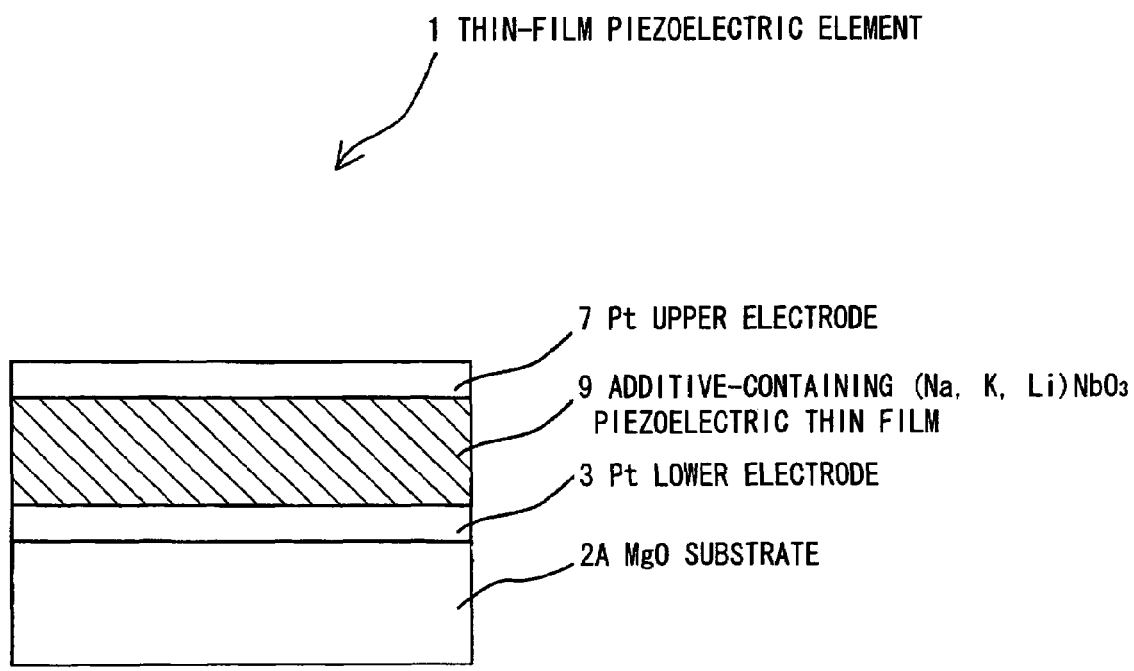
FIG. 5 is a cross-sectional view of a thin-film piezoelectric element according to a fifth preferred embodiment of the invention.

FIG. 5 illustrates a thin-film piezoelectric element according to a fifth preferred embodiment of the invention. A thin-film piezoelectric element 1 according to the fifth embodiment includes a (Na, K, Li)$NbO_3$ piezoelectric thin film containing an additive for enhancing dielectric strength voltage. Specifically, in this embodiment, using RF magnetron sputtering, on a MgO substrate 2A consisting of a MgO single crystal, there are sequentially formed a Pt lower electrode 3, a (Na, K, Li)$NbO_3$ piezoelectric thin film 9 containing an additive having higher dielectric strength voltage than that of (Na, K, Li)$NbO_3$, and a Pt upper electrode 7. The (Na, K, Li)$NbO_3$ piezoelectric thin film 9 containing the high dielectric strength voltage additive forms a piezoelectric portion.

As the high dielectric strength voltage additive, there can be used a high voltage-withstand dielectric such as $SrTiO_3$, $\alpha\text{-}Al_2O_3$, $Ta_2O_5$, $SiO_2$, or the like.

This fifth embodiment can offer the following advantages:

(a) The (Na, K, Li)$NbO_3$ piezoelectric thin film 9 containing the high dielectric strength voltage additive allows enhancement in voltage withstand of the entire piezoelectric portion, which thus allows use of even the low dielectric strength voltage (Na, K, Li)$NbO_3$ piezoelectric thin film.

(b) During piezoelectric operation of the (Na, K, Li)$NbO_3$ piezoelectric thin film 9, it is less likely to be damaged by peeling.

Sixth Embodiment

Figure 6:
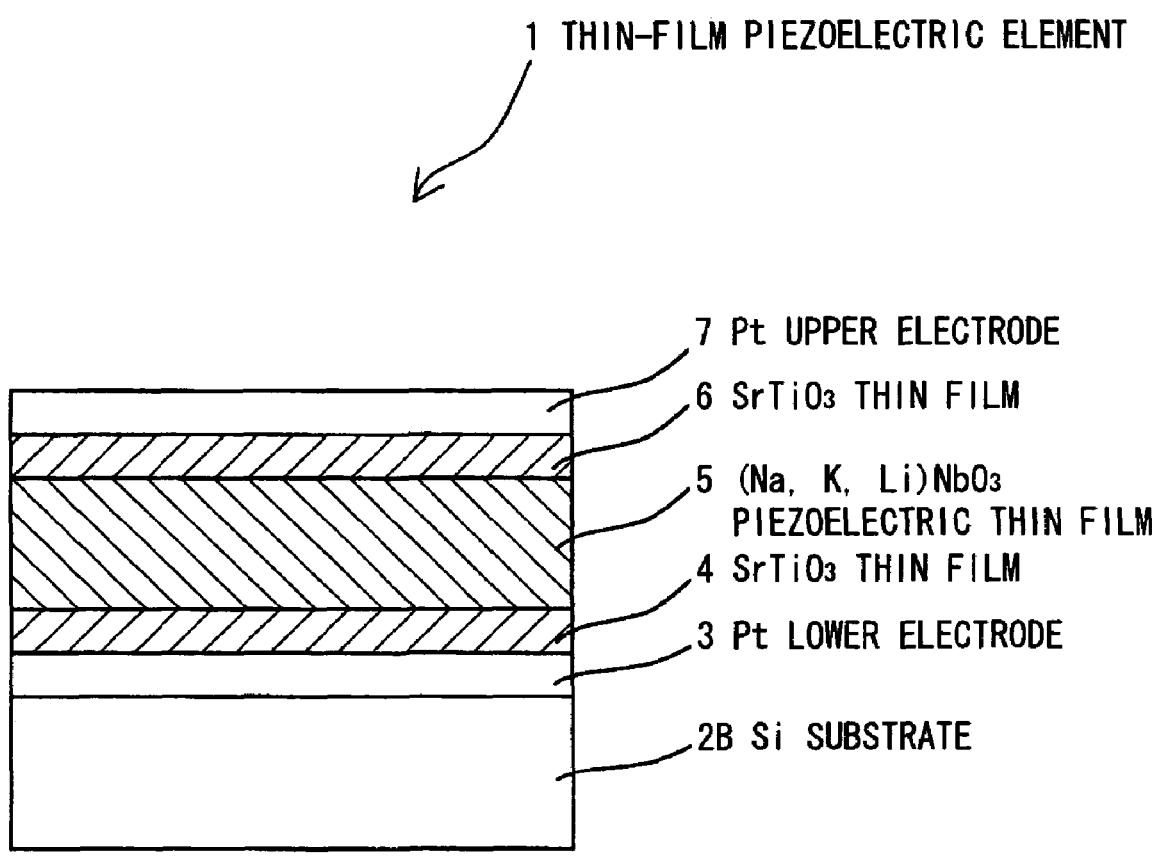
FIG. 6 is a cross-sectional view of a thin-film piezoelectric element according to a sixth preferred embodiment of the invention.

FIG. 6 illustrates a thin-film piezoelectric element according to a sixth preferred embodiment of the invention. A thin-film piezoelectric element 1 according to the sixth embodiment includes a Si substrate 2B. Using RF magnetron sputtering, on this Si substrate 2B, there are formed a Pt lower electrode 3 and a first $SrTiO_3$ thin film 4. Subsequently, using aerosol deposition, on the first $SrTiO_3$ thin film 4 is formed a (Na, K, Li)$NbO_3$ piezoelectric thin film 5. Thereafter, using RF magnetron sputtering, on the (Na, K, Li)$NbO_3$ piezoelectric thin film 5 are sequentially formed a second $SrTiO_3$ thin film 6 and a Pt upper electrode 7. The first SrTiO$_3$ thin film 4, (Na, K, Li)NbO$_3$ piezoelectric thin film 5, and second SrTiO$_3$ thin film 6 make up a piezoelectric portion. The Pt lower electrode 3, first SrTiO$_3$ thin film 4, (Na, K, Li)NbO$_3$ piezoelectric thin film 5, second SrTiO$_3$ thin film 6, and Pt upper electrode 7 all can also be formed by aerosol deposition.

The first and second SrTiO$_3$ thin films 4 and 6 have a 1 MV/cm or higher dielectric strength voltage, which is greater than that of the (Na, K, Li)NbO$_3$ piezoelectric thin film 5.

This sixth embodiment can offer the following advantages:

(a) Sandwiching the (Na, K, Li)NbO$_3$ piezoelectric thin film 5 between the first and second SrTiO$_3$ thin films 4 and 6 having excellent dielectric strength voltage allows enhancement in voltage withstand of the entire piezoelectric portion comprising the first and second SrTiO$_3$ thin films 4 and 6 and piezoelectric thin film 5, which thus allows use of even the low dielectric strength voltage (Na, K, Li)NbO$_3$ piezoelectric thin film 5.

(b) Because of lead-free piezoelectric material, the (Na, K, Li)NbO$_3$ piezoelectric thin film 5 is preferable from the points of view of ecology and pollution prevention.

(c) Sandwiching the (Na, K, Li)NbO$_3$ piezoelectric thin film 5 between the high voltage-withstand dielectrics allows prevention of diffusion of alkali metals such as Na, K, Li, etc., into the electrodes 3 and 7, which thereby allows extending the lifetime of the piezoelectric element.

(d) Sandwiching the (Na, K, Li)NbO$_3$ piezoelectric thin film 5 between the high voltage-withstand dielectrics allows good adhesion to the base of the (Na, K, Li)NbO$_3$ piezoelectric thin film 5, and enhancement in flatness of the piezoelectric element surface.

Embodiment 1

Embodiment 1 of the present invention corresponds to the above first embodiment, in which, as a substrate, there is used a MgO substrate 2A with (001) plane orientation, 20 mm×20 mm, and thickness 0.5 mm; and as a piezoelectric thin film, a (Na$_{0.47}$K$_{0.47}$Li$_{0.06}$)NbO$_3$ (hereinafter, (Na, K, Li)NbO$_3$) piezoelectric thin film 5 with a thickness of 3 µm.

One example of the fabrication method for embodiment 1 will next be explained. First, there is prepared a MgO substrate 2A with (001) plane orientation, 20 mm×20 mm, thickness 0.5 mm.

Then, using RF magnetron sputtering, on the MgO substrate 2A, there are sequentially formed a Pt lower electrode ((001) single plane orientation, film thickness 0.2 µm) 3, a first SrTiO$_3$ thin film (perovskite structure, tetragonal crystal, (001) single plane orientation, film thickness 0.01 µm) 4, a (Na, K, Li)NbO$_3$ piezoelectric thin film (perovskite structure, tetragonal crystal, (001) single plane orientation, film thickness 3.0 µm) 5, a second SrTiO$_3$ thin film (perovskite structure, tetragonal crystal, (001) single plane orientation, film thickness 0.01 µm) 6, and a Pt upper electrode ((001) single plane orientation, film thickness 0.02 µm) 7, to fabricate a thin-film piezoelectric element 1.

The formation conditions of the Pt lower electrode 3 are substrate temperature: 700° C.; discharge power: 200 W, gas introduced: Ar atmosphere, pressure: 2.5 Pa; deposition time: 10 min. Also, the formation conditions of the Pt upper electrode 7 are: substrate temperature: 700° C.; discharge power: 200 W, gas introduced: Ar atmosphere, pressure: 2.5 Pa; deposition time: 1 min.

The formation conditions of the SrTiO$_3$ thin films 4 and 6 are: substrate temperature: 700° C.; discharge power: 100 W, gas introduced: Ar atmosphere, pressure: 0.4 Pa; deposition time: 3 min.

The formation conditions of the (Na, K, Li)NbO$_3$ piezoelectric thin film 5 are substrate temperature: 600° C.; discharge power: 75 W, gas introduced: Ar atmosphere, pressure: 0.4 Pa; deposition time: 3 hr. and 30 min.

Comparison Example 1

Figure 7:
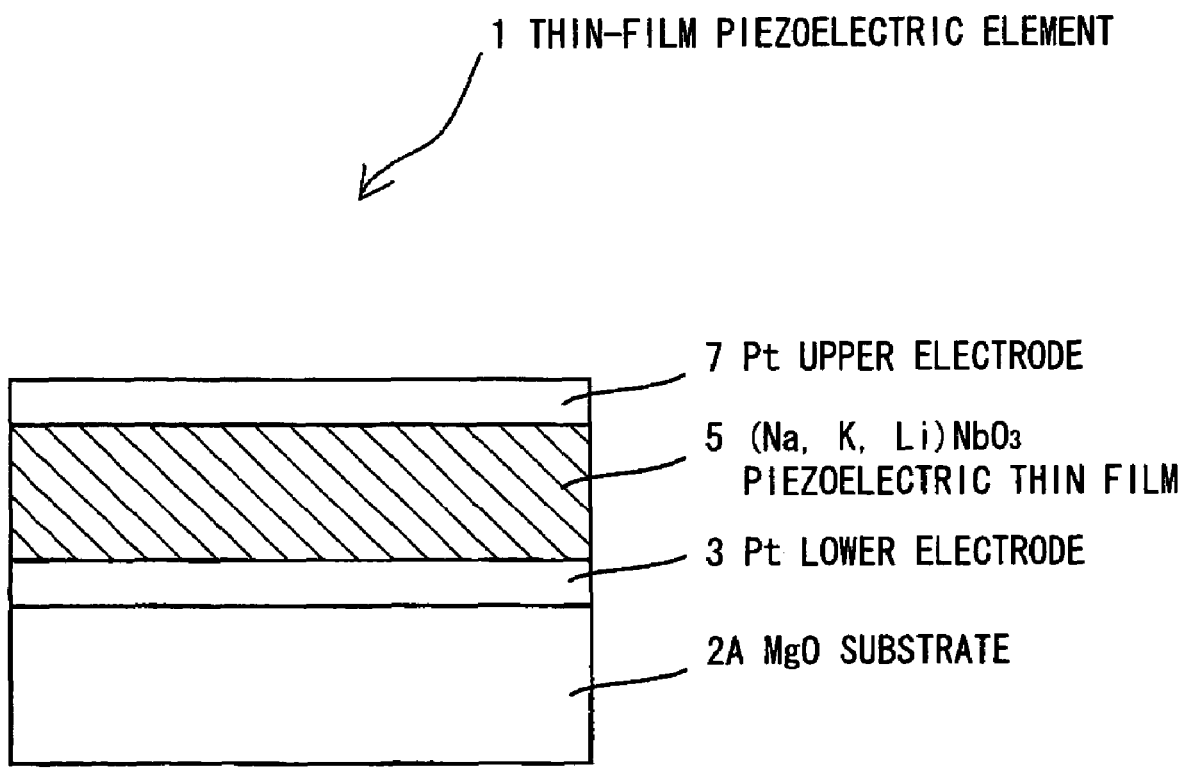
FIG. 7 is a cross-sectional view of a thin-film piezoelectric element of comparison example 1.

FIG. 7 illustrates a thin-film piezoelectric element of comparison example 1. This comparison example 1 shows a thin-film piezoelectric element with no first and second SrTiO$_3$ thin films, in comparison to embodiment 1. Specifically, using RF magnetron sputtering, on a MgO substrate 2A, there are sequentially formed a Pt lower electrode ((001) single plane orientation, film thickness 0.2 µm) 3, a (Na, K, Li)NbO$_3$ piezoelectric thin film (perovskite structure, tetragonal crystal, (001) single plane orientation, film thickness 3.0 µm) 5, and a Pt upper electrode ((001) single plane orientation, film thickness 0.02 µm) 7, to fabricate a thin-film piezoelectric element 1.

The formation conditions of the Pt lower electrode 3, (Na, K, Li)NbO$_3$ piezoelectric thin film 5 and Pt upper electrode 7 are the same as those of embodiment 1 and its details are therefore omitted.

Figure 8A:
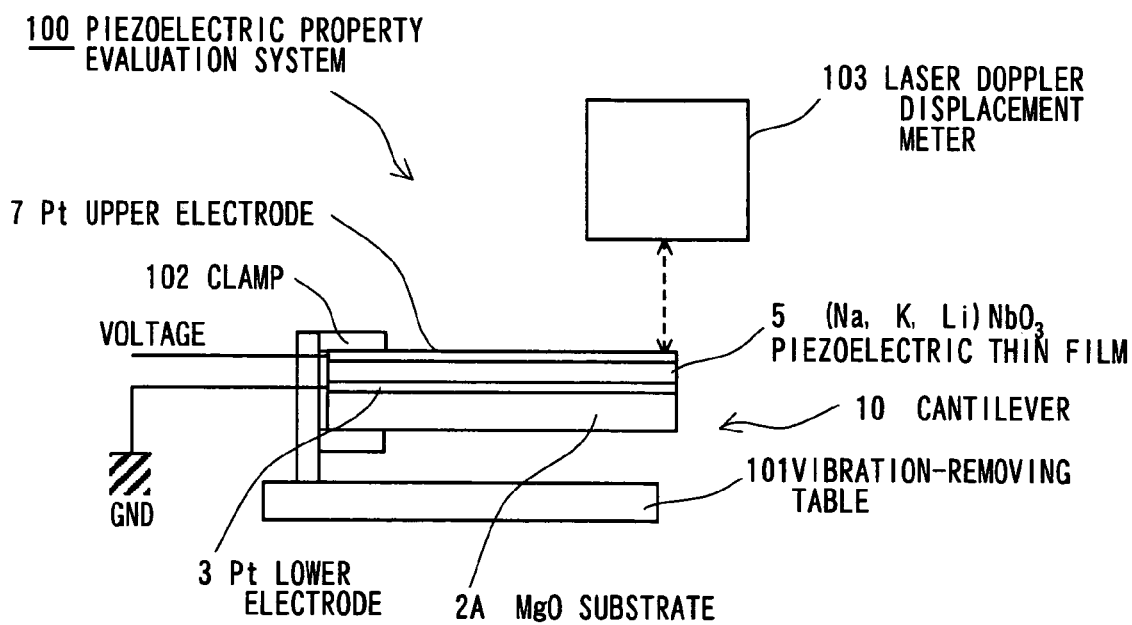
FIGS. 8A and 8B are respectively a schematic view of a piezoelectric property evaluation system, and a view illustrating an essential portion of a state after displacement.
Figure 8B:
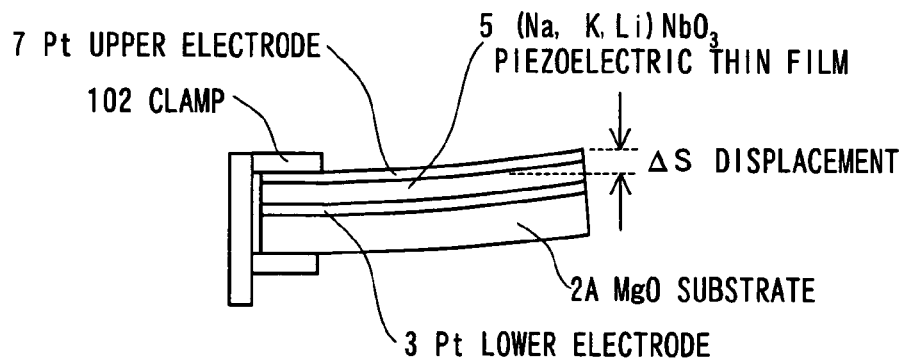
Figure 9:
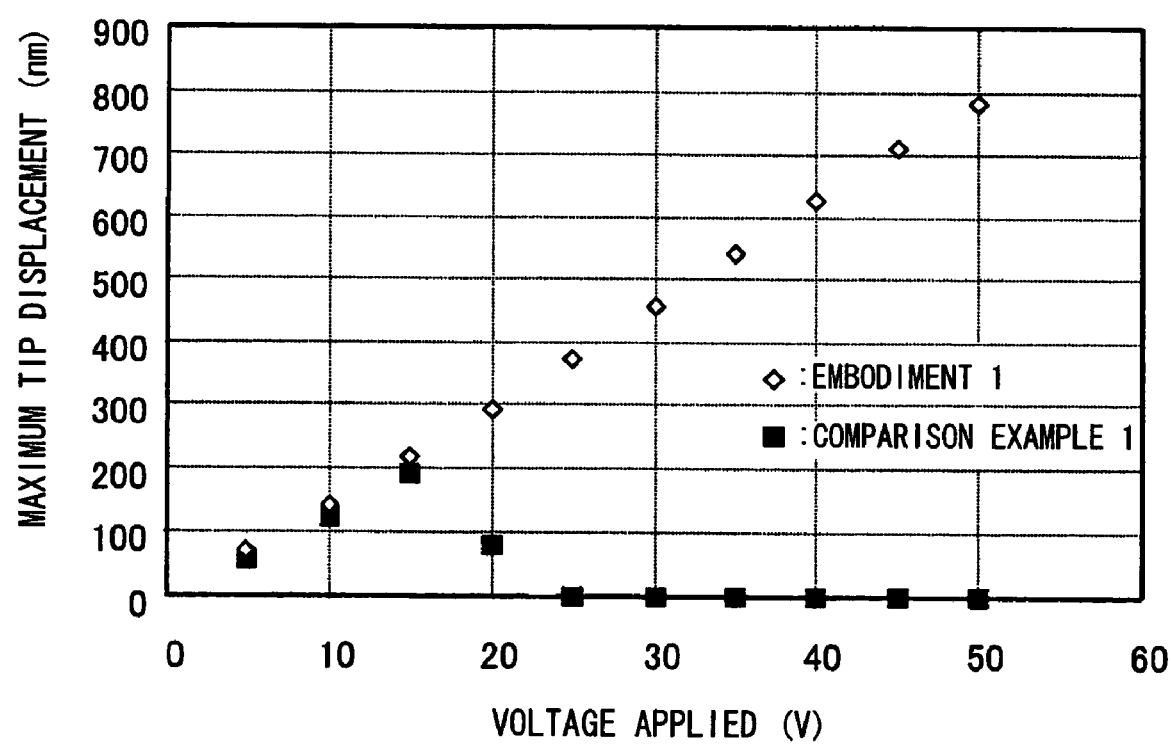
FIG. 9 is a graph showing the relationship between applied voltage and piezoelectric displacement for embodiment 1 and comparison example 1.

FIGS. 8A and 8B are respectively a schematic view of a piezoelectric property evaluation system, and a view illustrating an essential portion of a state after displacement. FIG. 9 shows the relationship between applied voltage and piezoelectric displacement for embodiment 1 and comparison example 1. The piezoelectric property evaluation system 100 is provided with a clamp 102 mounted on a vibration-removing table 101, and a laser Doppler displacement meter 103.

For above embodiment 1 and comparison example 1, the thin-film piezoelectric element 1 is cut in a 20 mm-long and 5 mm-wide rectangular shape to form a simplified unimorph cantilever 10.

The cantilever 10 is fixed by the clamp 102. In this state, voltage is applied to the (Na, K, Li)NbO$_3$ piezoelectric thin film 5 between both electrodes 3 and 7, to stretch the (Na, K, Li)NbO$_3$ piezoelectric thin film 5 and thereby bend the entire cantilever 10, and displace the tip of the cantilever 10. A displacement ΔS of the cantilever 10 tip is measured with the laser Doppler displacement meter 103.

It is found from FIG. 9 that the cantilever 10 of comparison example 1 produces leakage current at more than a voltage of 15 V (equivalently, an electric field of 50 kV/cm) applied, which makes it practically impossible to operate piezoelectrically.

On the other hand, it is found from FIG. 9 that, even in the case of a voltage of 50 V (equivalently, an electric field of 167 kV/cm) applied, the cantilever 10 of embodiment 1 performs proper piezoelectric operation without producing leakage current. This verifies that the use of the thin-film piezoelectric element 1 of embodiment 1 makes it possible to fabricate the thin-film piezoelectric element with more excellent dielectric strength voltage than that of the prior art, using the (Na, K, Li)NbO$_3$ piezoelectric thin film 5.

Embodiment 2

Embodiment 2 of the present invention corresponds to the sixth embodiment, in which, as a substrate, there is used a Si substrate 2B with (100) plane orientation, 4-inch round shape, and thickness 1.0 mm and having an about 0.5 μm thermally oxidized film formed on its surface; and as a piezoelectric thin film, a $(Na_{0.47}K_{0.47}Li_{0.06})NbO_3$ (hereinafter, (Na, K, Li)NbO$_3$) piezoelectric thin film 5 with a thickness of 10 μm.

One example of the fabrication method for embodiment 2 will next be explained. First, there is prepared a Si substrate 2B with (100) plane orientation, 4-inch round shape, and thickness 1.0 mm and having an about 0.5 μm thermally oxidized film formed on its surface.

Then, using RF magnetron sputtering, on the Si substrate 2B, there are sequentially formed a Pt lower electrode (film thickness 0.2 μm) 3, and a first SrTiO$_3$ thin film (perovskite structure, film thickness 0.03 μm) 4.

Subsequently, using aerosol deposition, on the first SrTiO$_3$ thin film 4 is formed a (Na, K, Li)NbO$_3$ piezoelectric thin film (perovskite structure, polycrystal consisting mainly of a tetragonal crystal, no orientation, film thickness 10 μm) 5. Thereafter, using RF magnetron sputtering, on the (Na, K, Li)NbO$_3$ piezoelectric thin film 5 are sequentially formed a second SrTiO$_3$ thin film (perovskite structure, film thickness 0.01 μm) 6 and a Pt upper electrode (film thickness 0.02 μm) 7, to fabricate a thin-film piezoelectric element 1.

Similarly to embodiment 1, the formation conditions of the Pt lower electrode 3 are substrate temperature: 700° C.; discharge power: 200 W, gas introduced: Ar atmosphere, pressure: 2.5 Pa; deposition time: 10 min. Also, similarly to embodiment 1, the formation conditions of the Pt upper electrode 7 are: substrate temperature: 700° C.; discharge power: 200 W, gas introduced: Ar atmosphere, pressure: 2.5 Pa; deposition time: 1 min.

The formation conditions of the SrTiO$_3$ thin films 4 and 6 are: substrate temperature: 700° C.; discharge power: 100 W, gas introduced: Ar atmosphere, pressure: 0.4 Pa; deposition time: 9 min.

FIG. 10 illustrates a schematic view of an aerosol deposition apparatus. This aerosol deposition apparatus 200 comprises a deposition chamber 201, a substrate holder 203 disposed within the deposition chamber 201 for holding a Si substrate 2B, an X—Y stage 202 for moving the substrate holder 203 in the X- and Y-directions parallel to the surface of the Si substrate 2B, an aerosol chamber 207 with $(Na_{0.47}K_{0.47}Li_{0.06})NbO_3$ fine particles with perovskite structure charged therein that are raw material for a (Na, K, Li)NbO$_3$ piezoelectric thin film 5, a He gas cylinder 204 for He-pressure-sending the fine-particle raw material charged in the aerosol chamber 207 into the deposition chamber 201 via a decompression valve 205, an MFC (a mass flow controller) 206 and a nozzle 208, and a pump 210 for evacuating the gas from the deposition chamber 201 via a powder filter 211. In the same figure, the Pt lower electrode 3 and the first SrTiO$_3$ thin film 4 are not shown in the Si substrate 2B.

The formation conditions of the (Na, K, Li)NbO$_3$ piezoelectric thin film 5 in aerosol deposition are as follows: As the fine-particle raw material, there is used 0.1-2.0 μm size $(Na_{0.47}K_{0.47}Li_{0.06})NbO_3$ fine particles with perovskite structure having good piezoelectric properties. 200 g of the fine-particle raw material is charged in the aerosol chamber 207, and as the carrier gas, He gas is used. The aerosol raw material in the aerosol chamber 207 is carried into the deposition chamber 201 by the He gas, passed through the nozzle 208 with the opening area of 0.3 mm×5 mm, thereby accelerated to a high speed (e.g., 100 m/s), and blasted onto the Si substrate 2B. The Si substrate 2B is continuously scanned relative to the nozzle 208 by use of the X-Y stage 202, for uniform film deposition over the entire surface of the Si substrate 2B. The flow of the He gas is 1-5 L/min, and the pressure within the deposition chamber 201 is 10 Pa.

Comparison Example 2

Figure 11:
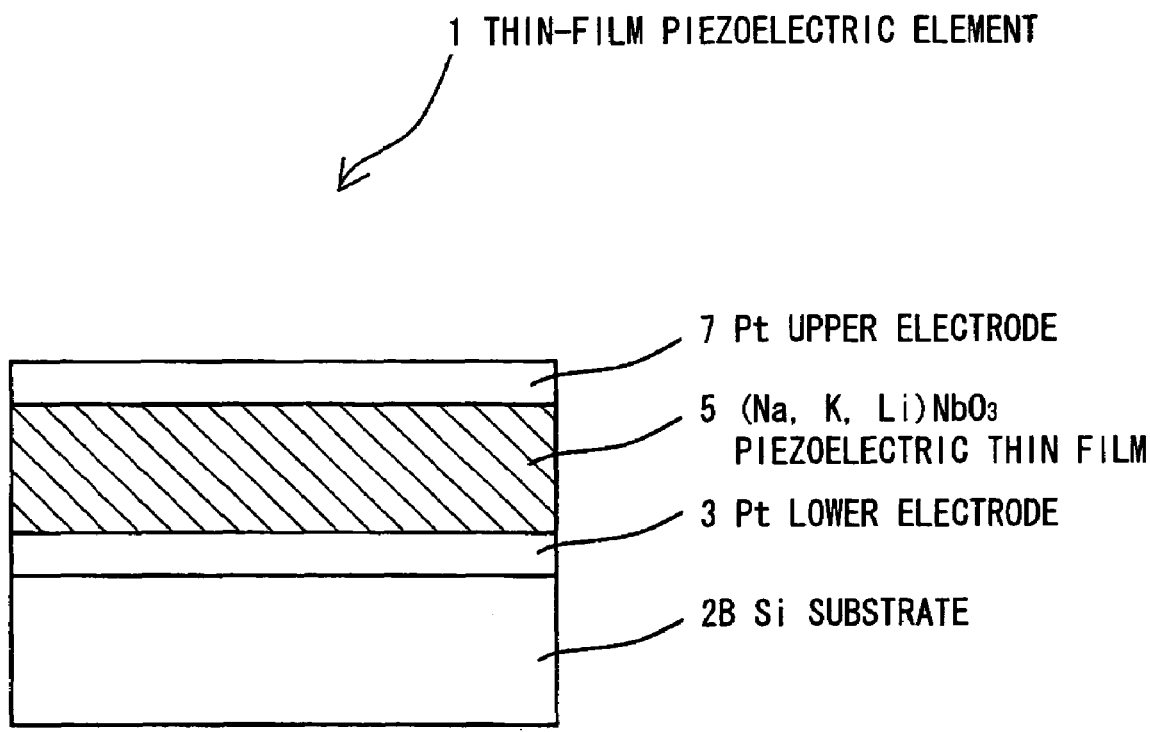
FIG. 11 is a cross-sectional view of a thin-film piezoelectric element of comparison example 2.

FIG. 11 illustrates a thin-film piezoelectric element of comparison example 2. This comparison example 2 shows a thin-film piezoelectric element with no first and second SrTiO$_3$ thin films, in comparison to embodiment 2. Specifically, using RF magnetron sputtering, on a Si substrate 2B with (100) plane orientation, 4-inch round shape, and thickness 1.0 mm and having an about 0.5 μm thermally oxidized film formed on its surface, there is formed a Pt lower electrode (film thickness 0.2 μm) 3. Subsequently, using aerosol deposition, there are sequentially formed a (Na, K, Li)NbO$_3$ piezoelectric thin film (perovskite structure, polycrystal consisting mainly of a tetragonal crystal, no orientation, film thickness 10 μm) 5 and a Pt upper electrode (film thickness 0.02 μm) 7, to fabricate a thin-film piezoelectric element 1.

The formation conditions of the Pt lower electrode 3, (Na, K, Li)NbO$_3$ piezoelectric thin film 5 and Pt upper electrode 7 are the same as those of embodiment 2 and its details are therefore omitted.

For above embodiment 2 and comparison example 2, the thin-film piezoelectric element 1 is cut in a 20 mm-long and 5 mm-wide rectangular shape to form a simplified unimorph cantilever. The longitudinal end of the cantilever is fixed by the clamp 102 of the piezoelectric property evaluation system 100 shown in FIGS. 8A and 8B. In this state, voltage is applied to the (Na, K, Li)NbO$_3$ piezoelectric thin film 5 between both electrodes 3 and 7, to stretch the (Na, K, Li)NbO$_3$ piezoelectric thin film 5 and thereby bend the entire cantilever, and displace the tip of the cantilever. A displacement ΔS of the cantilever 10 tip is measured with the laser Doppler displacement meter 103.

Figure 12:
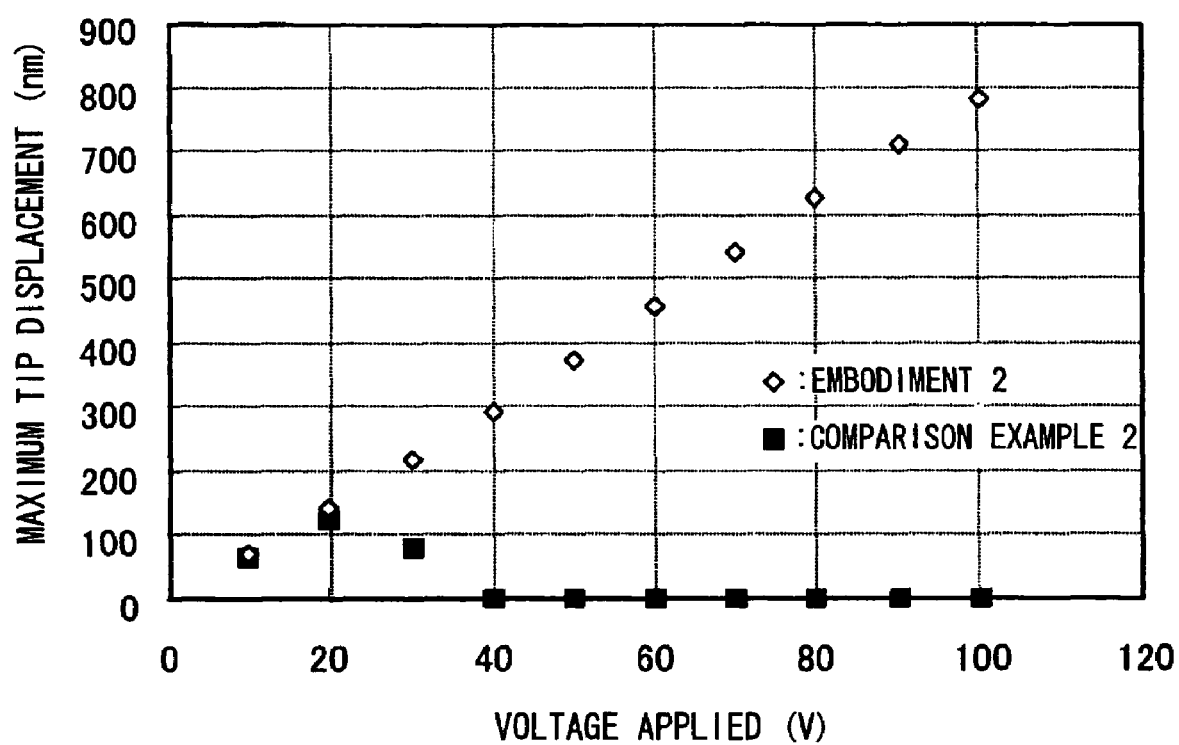
FIG. 12 is a graph showing the relationship between applied voltage and piezoelectric displacement for embodiment 2 and comparison example 2.

FIG. 12 shows the relationship between applied voltage and piezoelectric displacement for embodiment 2 and comparison example 2.

It is found from FIG. 12 that the cantilever of comparison example 2 produces leakage current at more than a voltage of 20 V (equivalently, an electric field of 20 kV/cm) applied, which makes it practically impossible to operate piezoelectrically. On the other hand, it is found that, even in the case of a voltage of 100 V (equivalently, an electric field of 100 kV/cm) applied, the cantilever of embodiment 2 performs proper piezoelectric operation without producing leakage current. This verifies that the use of the thin-film piezoelectric element 1 of embodiment 2 makes it possible to fabricate the thin-film piezoelectric element with more excellent dielectric strength voltage than that of the prior art, using the (Na, K, Li)NbO$_3$ piezoelectric thin film.

The present invention is not limited to each embodiment described above, but may be modified in various forms within the scope not departing from the gist of the invention.

Also, any combination of the structural elements of each embodiment described above may be done within the scope not departing from the gist of the invention. For instance, the MgO substrate of the first to fifth embodiment may be replaced with the Si substrate of the sixth embodiment, or another substrate.

Although the thin film of lithium potassium sodium niobate is described only with respect to the application to thin-film piezoelectric elements in each embodiment described above, its use is not limited to the application to thin-film piezoelectric elements, but may be considered to be applied to other various uses.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. A thin-film piezoelectric element, comprising:
a substrate, a lower electrode, a piezoelectric portion, and an upper electrode that are sequentially formed on the substrate,
wherein the piezoelectric portion comprises a dielectric thin film that comprises an alkali niobium oxide-based perovskite structure expressed by general formula $(Na_xK_yLi_z)NbO_3$ ($0<x<1$, $0<y<1$, $0 \leq z<1$, $x+y+z=1$), and a high voltage-withstand dielectric that has a dielectric strength voltage greater than that of the dielectric thin film.

2. The thin-film piezoelectric element according to claim 1, wherein:
the high voltage-withstand dielectric is inserted in a layered form between the dielectric thin film and the lower or upper electrode.

3. The thin-film piezoelectric element according to claim 1, wherein:
the high voltage-withstand dielectric is inserted in a layered form between the dielectric thin film and the lower electrode and between the dielectric thin film and the upper electrode, respectively.

4. The thin-film piezoelectric element according to claim 1, wherein:
the high voltage-withstand dielectric is inserted in a layered form in the dielectric thin film.

5. The thin-film piezoelectric element according to claim 1, wherein:
the high voltage-withstand dielectric is mixed as an additive in the dielectric thin film.

6. The thin-film piezoelectric element according to claim 1, wherein:
the high voltage-withstand dielectric comprises $SrTiO_3$, $\alpha\text{-}Al_2O_3$, $Ta_2O_5$, or $SiO_2$.

7. The thin-film piezoelectric element according to claim 1, wherein:
the high voltage-withstand dielectric has a dielectric strength voltage of 1 MV/cm or higher.

8. The thin-film piezoelectric element according to claim 1, wherein:
the substrate comprises a MgO monocrystalline substrate or a Si substrate.

9. The thin-film piezoelectric element according to claim 1, wherein:
at least one of the substrate, the lower electrode, the piezoelectric portion and the upper electrode comprises a microfabrication with a width of 1 mm or less.

10. The thin-film piezoelectric element according to claim 1, wherein:
at least one of the lower electrode, the piezoelectric portion and the upper electrode is formed by RF magnetron sputtering.

11. The thin-film piezoelectric element according to claim 1, wherein:
at least one of the lower electrode, the piezoelectric portion and the upper electrode is formed by aerosol deposition.

12. The thin-film piezoelectric element according to claim 1, wherein:
the piezoelectric portion is sandwiched between the upper electrode and the lower electrode.

* * * * *